United States Patent
Simon

(10) Patent No.: US 7,636,475 B2
(45) Date of Patent: *Dec. 22, 2009

(54) IMPRINT LITHOGRAPHY

(75) Inventor: Klaus Simon, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 561 days.

This patent is subject to a terminal disclaimer.

(21) Appl. No.: 11/303,026

(22) Filed: Dec. 16, 2005

(65) Prior Publication Data

US 2006/0159305 A1  Jul. 20, 2006

Related U.S. Application Data

(63) Continuation-in-part of application No. 11/019,521, filed on Dec. 23, 2004.

(51) Int. Cl.
G06K 9/00 (2006.01)
G03B 27/58 (2006.01)
G03B 27/42 (2006.01)

(52) U.S. Cl. ........................................ 382/173; 355/72

(58) Field of Classification Search ................. 382/100, 382/154, 173; 430/22, 30, 322; 438/690, 438/945; 216/2, 44, 52, 67, 72; 355/35, 355/37, 40, 55, 67–71; 425/385, 403
See application file for complete search history.

(56) References Cited

U.S. PATENT DOCUMENTS

| | | | |
|---|---|---|---|
| 5,512,131 A | 4/1996 | Kumar et al. ............. 156/655.1 |
| 5,772,905 A | 6/1998 | Chou ........................... 216/44 |
| 6,165,911 A | 12/2000 | Calveley ..................... 438/754 |
| 6,211,948 B1 | 4/2001 | Lüllau et al. ................... 355/71 |
| 6,238,852 B1 | 5/2001 | Klosner | |
| 6,309,580 B1 | 10/2001 | Chou ......................... 264/338 |
| 6,334,960 B1 | 1/2002 | Willson et al. ................. 216/52 |
| 6,365,059 B1 | 4/2002 | Pechenik ...................... 216/52 |
| 6,375,870 B1 | 4/2002 | Visovsky et al. ........... 264/1.31 |
| 6,416,311 B1 | 7/2002 | Springer et al. ............. 425/385 |
| 6,482,742 B1 | 11/2002 | Chou ......................... 438/690 |
| 6,518,189 B1 | 2/2003 | Chou ......................... 438/706 |
| 6,656,341 B2 | 12/2003 | Petersson et al. ............ 205/667 |
| 6,671,034 B1 * | 12/2003 | Hatakeyama et al. ......... 355/67 |
| 6,696,220 B2 | 2/2004 | Bailey et al. ............. 430/272.1 |

(Continued)

FOREIGN PATENT DOCUMENTS

DE  40 07 716 A1  8/1991

(Continued)

OTHER PUBLICATIONS

Haisma et al., "Mold-assisted nanolithography: A process for reliable pattern replication," J. Vac. Sci. Technol. B 14(6), pp. 4124-4128, (Nov./Dec. 1996).

(Continued)

*Primary Examiner*—Amir Alavi
(74) *Attorney, Agent, or Firm*—Pillsbury Winthrop Shaw Pittman, LLP

(57) ABSTRACT

An imprinting method is disclosed that, in embodiment, includes contacting first and second spaced target regions of an imprintable medium on a substrate with first and second templates respectively to form respective first and second imprints in the medium and separating the first and second templates from the imprinted medium.

40 Claims, 7 Drawing Sheets

U.S. PATENT DOCUMENTS

| | | | |
|---|---|---|---|
| 6,719,915 B2 | 4/2004 | Willson et al. | 216/44 |
| 6,805,054 B1 | 10/2004 | Meissl et al. | 101/483 |
| 6,890,688 B2* | 5/2005 | Mancini et al. | 430/5 |
| 6,900,881 B2* | 5/2005 | Sreenivasan et al. | 355/72 |
| 6,921,615 B2 | 7/2005 | Sreenivasan et al. | 430/22 |
| 6,932,934 B2* | 8/2005 | Choi et al. | 264/496 |
| 6,951,173 B1* | 10/2005 | Meissl et al. | 101/483 |
| 7,027,156 B2 | 4/2006 | Watts et al. | 356/401 |
| 7,060,402 B2 | 6/2006 | Choi et al. | 430/22 |
| 7,070,405 B2* | 7/2006 | Sreenivasan et al. | 425/174.4 |
| 7,144,539 B2 | 12/2006 | Olsson | 264/293 |
| 7,229,273 B2 | 6/2007 | Bailey et al. | 425/385 |
| 7,309,225 B2 | 12/2007 | McMackin et al. | 425/215 |
| 7,396,475 B2* | 7/2008 | Sreenivasan | 216/2 |
| 7,410,904 B2* | 8/2008 | Stasiak et al. | 438/700 |
| 2002/0093122 A1 | 7/2002 | Choi et al. | 264/401 |
| 2002/0094496 A1 | 7/2002 | Choi et al. | 430/322 |
| 2002/0132482 A1 | 9/2002 | Chou | 438/692 |
| 2002/0167117 A1 | 11/2002 | Chou | 264/338 |
| 2002/0177319 A1 | 11/2002 | Chou | 438/690 |
| 2003/0034329 A1 | 2/2003 | Chou | 216/44 |
| 2003/0080471 A1 | 5/2003 | Chou | 264/338 |
| 2003/0080472 A1 | 5/2003 | Chou | 264/338 |
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0051055 A1 | 3/2004 | Kruit | 250/492.3 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0169003 A1 | 9/2004 | Lee et al. | 216/4 |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0039618 A1 | 2/2005 | Heidari et al. | 101/368 |
| 2005/0064054 A1 | 3/2005 | Kasumi | 425/112 |
| 2005/0178280 A1 | 8/2005 | Lee et al. | 101/453 |
| 2005/0184436 A1 | 8/2005 | Jeong et al. | 264/496 |
| 2005/0189676 A1 | 9/2005 | Sreenivasan | |
| 2006/0019183 A1 | 1/2006 | Voisin | 430/22 |
| 2006/0035164 A1 | 2/2006 | Schaper | 430/200 |
| 2006/0137555 A1* | 6/2006 | Simon | 101/483 |
| 2006/0144814 A1* | 7/2006 | Kolesnychenko et al. | 216/41 |
| 2006/0147820 A1 | 7/2006 | Colburn et al. | 430/22 |
| 2006/0159305 A1* | 7/2006 | Simon | 382/100 |
| 2007/0102838 A1* | 5/2007 | Simon | 264/40.1 |
| 2007/0102844 A1* | 5/2007 | Simon et al. | 264/259 |
| 2007/0132152 A1 | 6/2007 | Choi et al. | |
| 2007/0141191 A1 | 6/2007 | Kruijt-Stegeman et al. | 425/174.4 |

FOREIGN PATENT DOCUMENTS

| | | |
|---|---|---|
| JP | 52-26171 A | 2/1977 |
| JP | 2-128337 A | 5/1990 |
| JP | 8-51069 A | 2/1996 |
| JP | 9-508984 | 9/1997 |
| JP | 2001-234383 A | 8/2001 |
| JP | 2002-91012 A | 3/2002 |
| JP | 2002-372791 | 12/2002 |
| JP | 2002-543582 | 12/2002 |
| JP | 2003-287605 A | 10/2003 |
| JP | 2004-504718 | 2/2004 |
| JP | 2005-026462 | 1/2005 |
| JP | 2005-045168 | 2/2005 |
| JP | 2005-88444 A | 4/2005 |
| JP | 2005-116022 A | 4/2005 |
| JP | 2005-533393 | 11/2005 |
| JP | 2007-531985 | 11/2007 |
| JP | 2008-512274 | 4/2008 |
| WO | WO 91/13511 | 9/1991 |
| WO | WO 01/79591 A1 | 10/2001 |
| WO | WO 01/79592 A1 | 10/2001 |
| WO | WO 03/099463 | 12/2003 |
| WO | WO 2004/086471 | 10/2004 |

OTHER PUBLICATIONS

Stephen Y. Chou, et al., "Nanoimprint Lithography", J. Vac. Sci. Technol. B 14(6), Nov./Dec. 1996, pp. 4129-4133.

European Search Report issued for European Patent Application No. 05257614.7—1226, dated Oct. 12, 2006.

McMackin et al., "Step and Repeat UV Nanoimprint Lithography Tools and Processes," Proceedings of SPIE, vol. 5374, 2004, pp. 222-231.

McMackin et al., "Design and Performance of a Step and Repeat Imprinting Machine," Proceedings of SPIE, vol. 5037, 2003, pp. 178-186.

Heon Lee et al., Full Wafer Scale Near Zero Residual Nano-Imprinting Lithography Using UV Curable Monomer Solution, Microelectronic Engineering 77 (2005) pp. 42-47.

English translation of Notice of Reasons for Rejection issued for JP Patent Appln. No. 2005-367350, dated Dec. 24, 2008.

Notice of Reasons for Rejection for Japanese Patent Application No. 2005-367350 dated May 12, 2009.

* cited by examiner

IMPRINT LITHOGRAPHY

This application is a continuation-in-part application of pending U.S. patent application Ser. No. US 11/019,521, filed Dec. 23, 2004, the content of which is herein incorporated in its entirety by reference.

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of a short wavelength. However, there are problems associated with such reductions. Lithographic apparatus using 193 nm wavelength radiation are starting to be adopted but even at this level, diffraction limitations may become a barrier. At lower wavelengths, the transparency of projection system materials is poor. Thus, optical lithography capable of enhanced resolution will likely require complex optics and rare materials and thus will be expensive.

An alternative method to printing sub-100 nm features, known as imprint lithography, comprises transferring a pattern to a substrate by imprinting a pattern into an imprintable medium using a physical mould or template. The imprintable medium may be the substrate or a material coated onto a surface of the substrate. The imprintable medium may be functional or may be used as a "mask" to transfer a pattern to an underlying surface. The imprintable medium may, for instance, be provided as a resist deposited on a substrate, such as a semiconductor material, to which the pattern defined by the template is to be transferred. Imprint lithography is thus essentially a moulding process on a micrometer or nanometer scale in which the topography of a template defines the patterns created on a substrate. Patterns may be layered as with optical lithography processes so that in principle imprint lithography could be used for such applications as integrated circuit manufacture.

The resolution of imprint lithography is limited only by the resolution of the template fabrication process. For instance, imprint lithography has been used to produce features in the sub-50 nm range with good resolution and line edge roughness. In addition, imprint processes may not require the expensive optics, advanced illumination sources or specialized resist materials typically required for optical lithography processes.

SUMMARY

According to a first aspect of the invention, there is provided an imprinting method, comprising providing first and second spaced target regions of a substrate with imprintable medium, contacting the first and second spaced target regions with first and second templates respectively to form respective first and second imprints in the medium, separating the first and second templates from the imprinted medium, providing third and fourth spaced target regions of the substrate with imprintable medium, displacing the first template in a first direction from the first region to a third region of the medium and displacing the second template in a second direction from the second region to a fourth region of the medium, and contacting the third and fourth target regions with the first and second templates respectively to form respective third and fourth imprints in the medium. In an embodiment, separate first, second, third and fourth volumes of the imprintable medium may be provided on the substrate to provide the spaced target regions of the medium.

In this way, it may be possible to imprint a significant area of the substrate in a short time, which may improve the throughput of an imprint lithography system. Each template may be used to imprint a plurality of spaced regions of the imprintable medium.

The first direction may take any desirable orientation in relation to the second direction. For example, the first direction may be angularly offset from the second direction by any appropriate angle to enable the various regions of the imprintable medium to be imprinted in the optimal manner for a given imprint system. In an embodiment, the first direction is substantially parallel to the second direction.

In an embodiment, the first and second templates contact the medium simultaneously, alternatively, the first and second templates may contact the medium sequentially. When contacting the medium sequentially, the timing between each sequential contacting step may be monitored and/or controlled to provide an optimum process to imprint a particular substrate with a particular pattern.

According to an aspect of the invention, there is provided a method for patterning a substrate, comprising:

contacting first and second spaced target regions of an imprintable medium on a substrate with first and second templates respectively to form respective first and second imprints in the medium, each imprint comprising a pattern feature and an area of reduced thickness;

separating the first and second templates from the imprinted medium;

etching the area of reduced thickness in the first and second target regions to expose predefined areas of the substrate; and etching the exposed predefined areas of the substrate.

Since multiple templates are employed, the rate at which a substrate is patterned may be increased relative to conventional methods employing a single template.

In an embodiment, the method comprises, after separating the templates from the imprinted medium and before etching the areas of reduced thickness, displacing the first template in a first direction from the first region to a third region of the medium and displacing the second template in a second direction from the second region to a fourth region of the medium, and contacting the third and fourth target regions with the first and second templates respectively to form respective third and fourth imprints in the medium, each imprint comprising a pattern feature and an area of reduced thickness.

According to an aspect of the invention, there is provided an imprinting apparatus, comprising a substrate table configured to hold a substrate, a template support configured to support first and second templates, the template support configured to cause the first and second templates to contact first and second spaced target regions respectively of an imprintable medium on the substrate to form respective first and second imprints in the medium and to cause the first and second templates to separate from the imprinted medium, and a first dispenser configured to provide a first volume of the imprintable medium and a second dispenser configured to provide a second volume of the imprintable medium, to provide the first and second spaced target regions.

In this way, the imprinting apparatus may imprint a significant area of the substrate in a short time, which may improve the throughput of an imprint lithography system.

In an embodiment, the template support is operable such that, after separating the first and second templates from the first and second regions of the imprinted medium, the first template is displaced in a first direction from the first region to a third region of the medium and the second template is displaced in a second direction from the second region to a fourth region of the medium, and the template support is operable to cause the third and fourth target regions to be contacted with the first and second templates respectively to form respective third and fourth imprints in the medium.

In an embodiment, the first and second dispensers are associated with the first and second templates respectively. The first and second dispensers may be fixed relative to the first and second templates respectively, or may be moveable independently of the first and second templates.

In an embodiment, the first and second dispensers are provided with a plurality of apertures. The plurality of apertures may comprise a two-dimensional array of apertures. Alternatively, the plurality of apertures may comprise a single row of apertures. Dispensers may be associated with two or more sides of the templates.

The apparatus and method of the present invention may be suitable for application in a drop on demand process (e.g., step and flash imprint lithography—SFIL). Accordingly, in an embodiment, the method and/or apparatus may be provided to enable this process.

Appropriately, one or more dispensers may be configured to provide separate third and fourth volumes of an imprintable medium on a substrate to provide the third and fourth spaced target regions.

While the first direction may take any desirable orientation in relation to the second direction, in an embodiment, the first direction is substantially parallel to the second direction.

The template support may be operable so that the first and second templates contact the first and second regions of the medium simultaneously, alternatively, the template support may be operable so that the first and second templates contact the first and second regions of the medium sequentially.

Appropriately, the template support may be configured so that the first template is fixed relative to the second template. Alternatively, the template support may be configured so that the first template is moveable relative to the second template.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
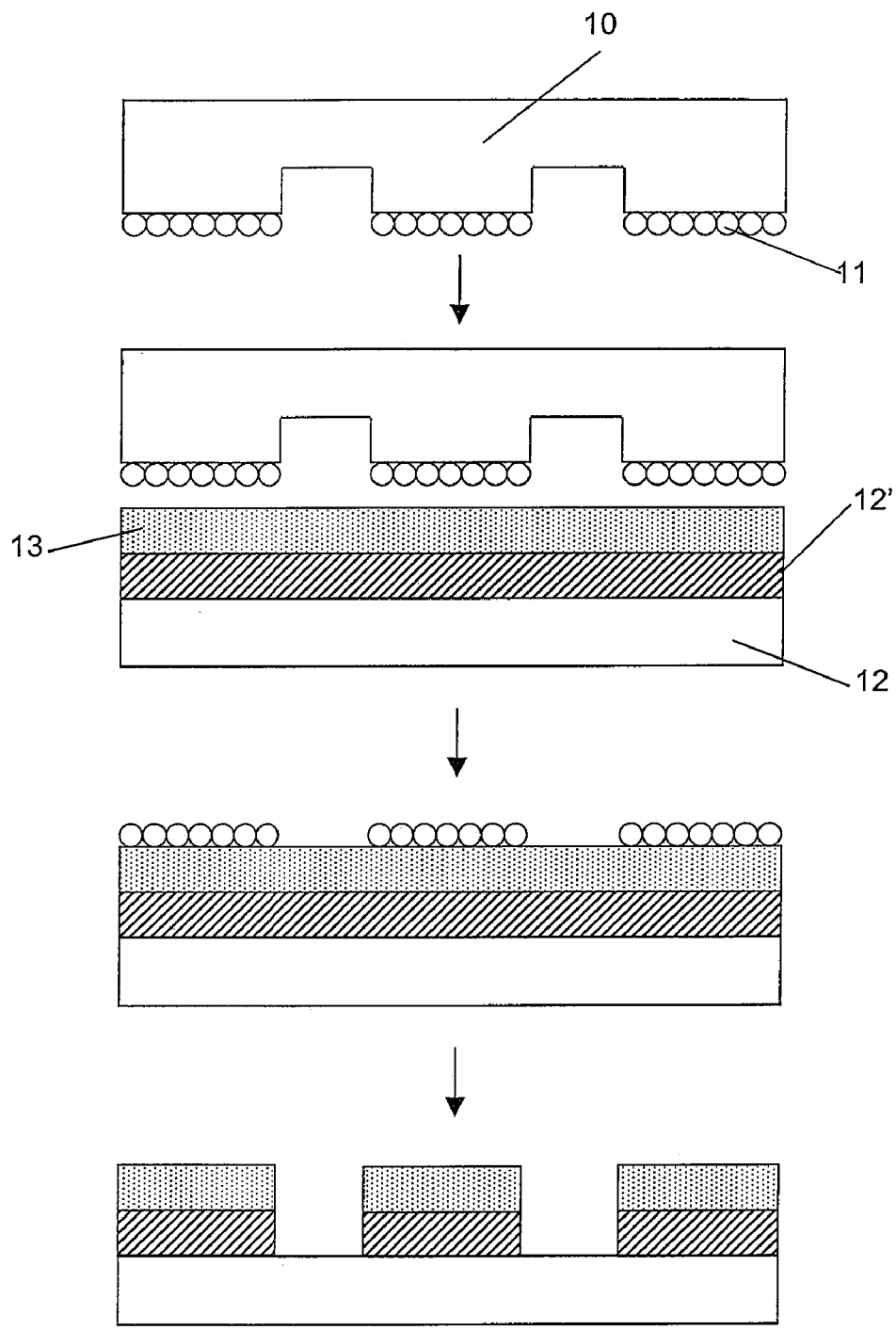
FIG. 1a-1c illustrate examples of conventional soft, hot and UV lithography process respectively.
Figure 1B:
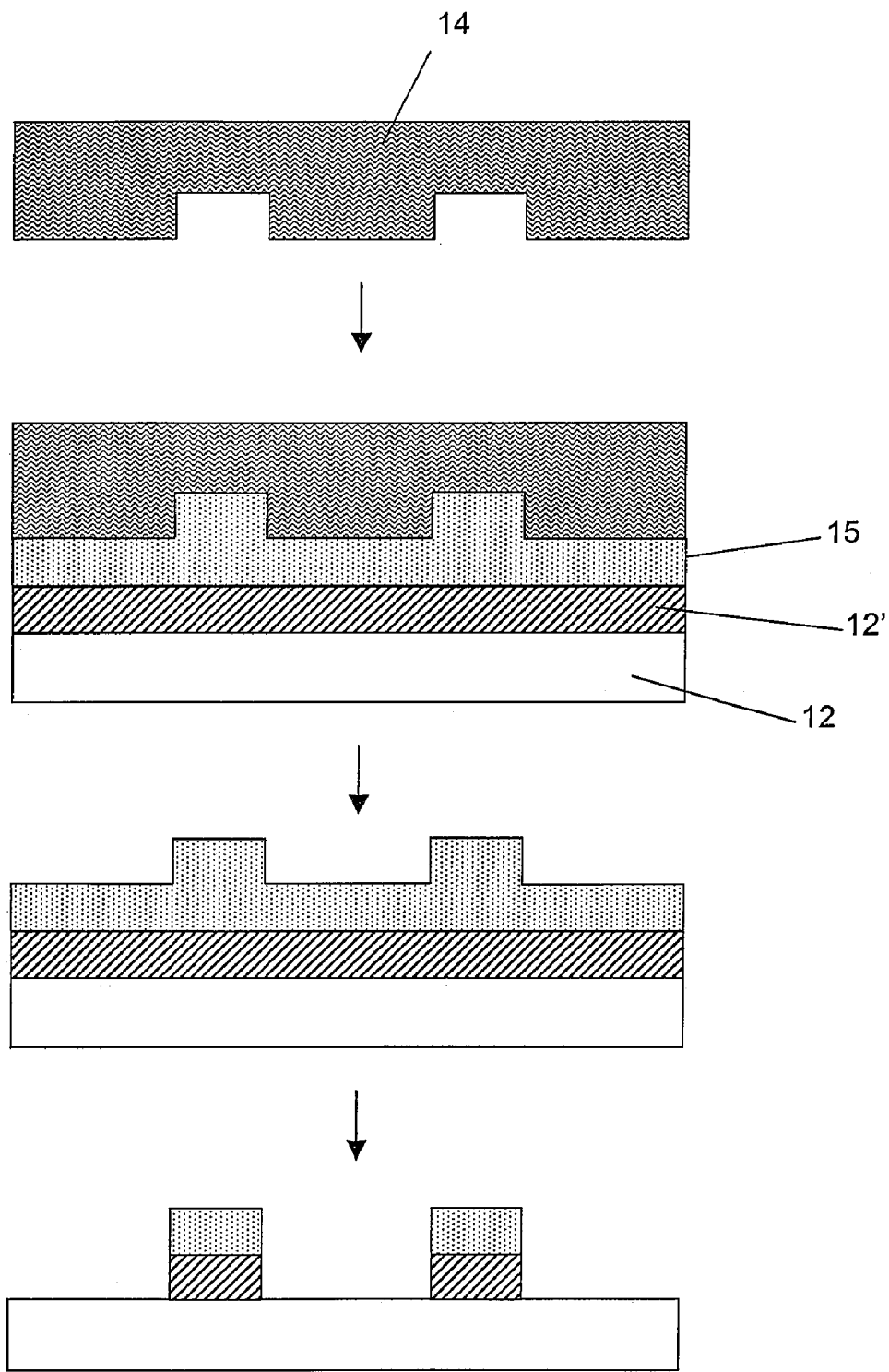
Figure 1C:
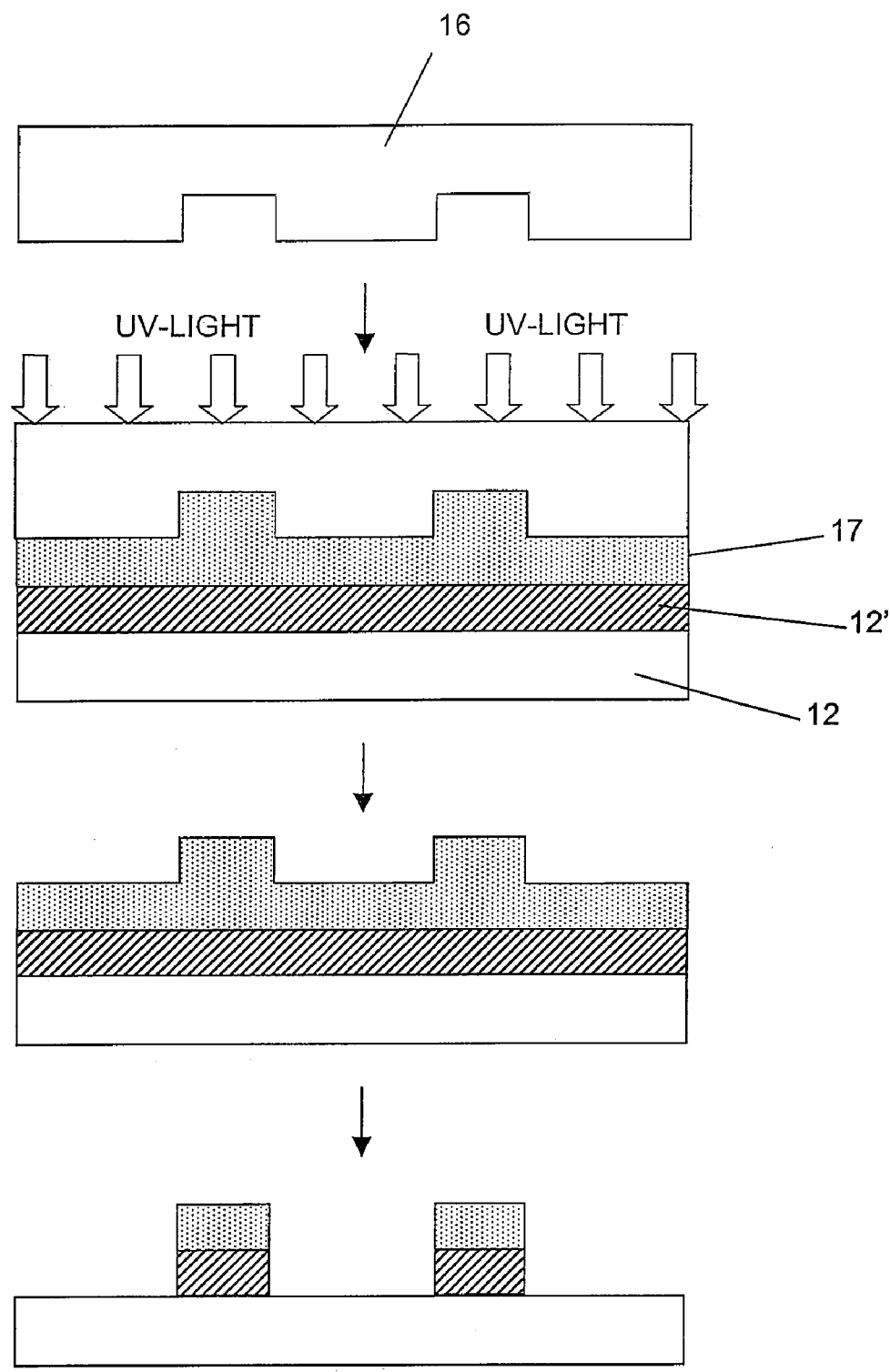

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of substrate. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
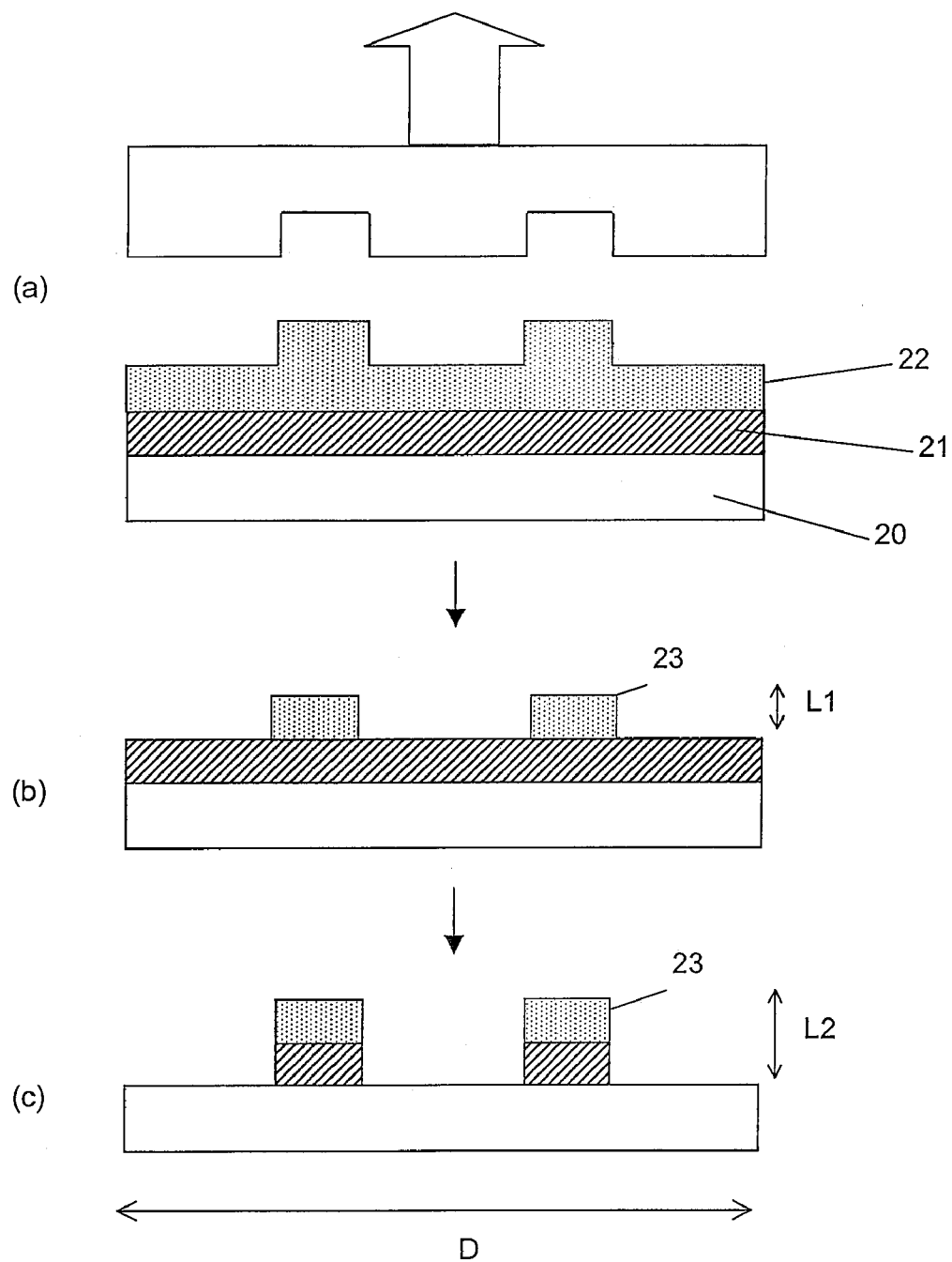
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as will be described below.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. This may be exacerbated by the relatively high pressure required for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylatee. In general, any photopolymerisable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerise and thus cure it. Upon removal of the template, the remaining steps of etching the residual layer of resist are the same or similar as for the hot embossing process described above. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g. activate a polymerisation or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description above, and below, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch the resin will have nowhere to flow.

Although reference is made above to depositing UV curable liquids onto a substrate, the liquids could also be deposited on the template and in general the same techniques and considerations will apply.

Figure 3:
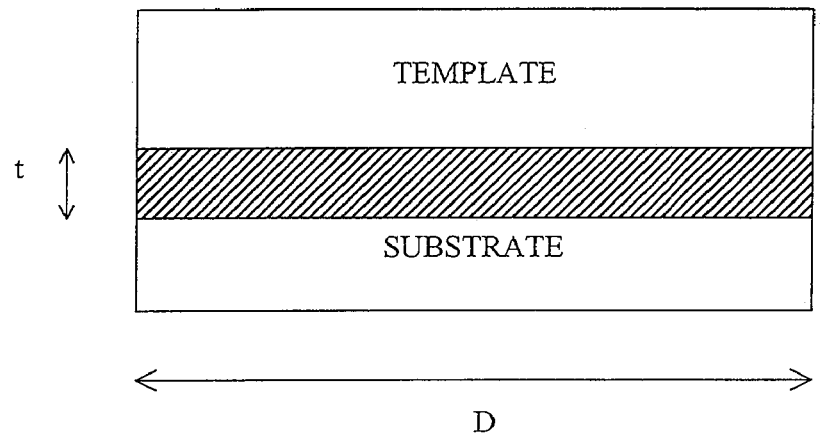
FIG. 3 illustrates relative dimensions of template features compared to the thickness of a typical imprintable resist layer deposited on a substrate.

FIG. 3 illustrates the relative dimensions of the template, imprintable material (curable monomer, thermosetting resin, thermoplastic, etc.), and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer of imprintable material left after stamping is useful in protecting the underlying substrate, but may also impact obtaining high resolution and/or overlay accuracy. The first 'breakthrough' etch is isotropic (non-selective) and will thus to some extent erode the features imprinted as well as the residual layer. This may be exacerbated if the residual layer is overly thick and/or uneven.

This etching may, for instance, lead to a variation in the thickness of features ultimately formed on the underlying substrate (i.e. variation in the critical dimension). The uniformity of the thickness of a feature that is etched in the transfer layer in the second anisotropic etch is dependant upon the aspect ratio and integrity of the shape of the feature left in the resin. If the residual resin layer is uneven, then the non-selective first etch may leave some of these features with "rounded" tops so that they are not sufficiently well defined to ensure good uniformity of feature thickness in the second and any subsequent etch process.

In principle, the above problem may be reduced by ensuring the residual layer is as thin as possible but this may require application of undesirably large pressures (possibly increasing substrate deformation) and relatively long imprinting times (perhaps reducing throughput).

As noted above, the resolution of the features on the template surface is a limiting factor on the attainable resolution of features printed on the substrate. The templates used for hot and UV imprint lithography are generally formed in a two-stage process. Initially, the required pattern is written using, for example, electron beam writing to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be desired as the template is effectively a 1x mask with the resolution of the transferred pattern being limited by the resolution of the pattern on the template.

The release characteristics of the template are also a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the imprintable medium, and in the case of hot imprint lithography, it may also be subjected to high pressure and temperature. The force, pressure and/or temperature may cause wearing of the template, and may adversely affect the shape of the pattern imprinted upon the substrate.

In hot imprint lithography, a potential advantage may be realized in using a template of the same or similar material to the substrate to be patterned in order to help reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disk magnetic media, flat panel displays, thin-film magnetic heads, etc.

While in the description above particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non linear response, etc. For example, the functional material may form a conductive layer, a semiconductive layer, a dielectric layer or a layer having another desirable mechanical, electrical or optical property. Some organic substances may also be appropriate functional materials. Such applications may be within the scope of one or more embodiments of the present invention.

An imprint lithography system may offer an advantage over optical lithography in terms of reduced feature width. However, the time taken to stamp and cure the resin at each location on the substrate may limit the throughput of an imprint lithography system and therefore a possible economic advantage of adopting imprint lithography.

An embodiment of the present invention involves using a plurality of templates located on the same imprinting apparatus operating in parallel to each other, rather than using a single template on the apparatus.

Figure 4:
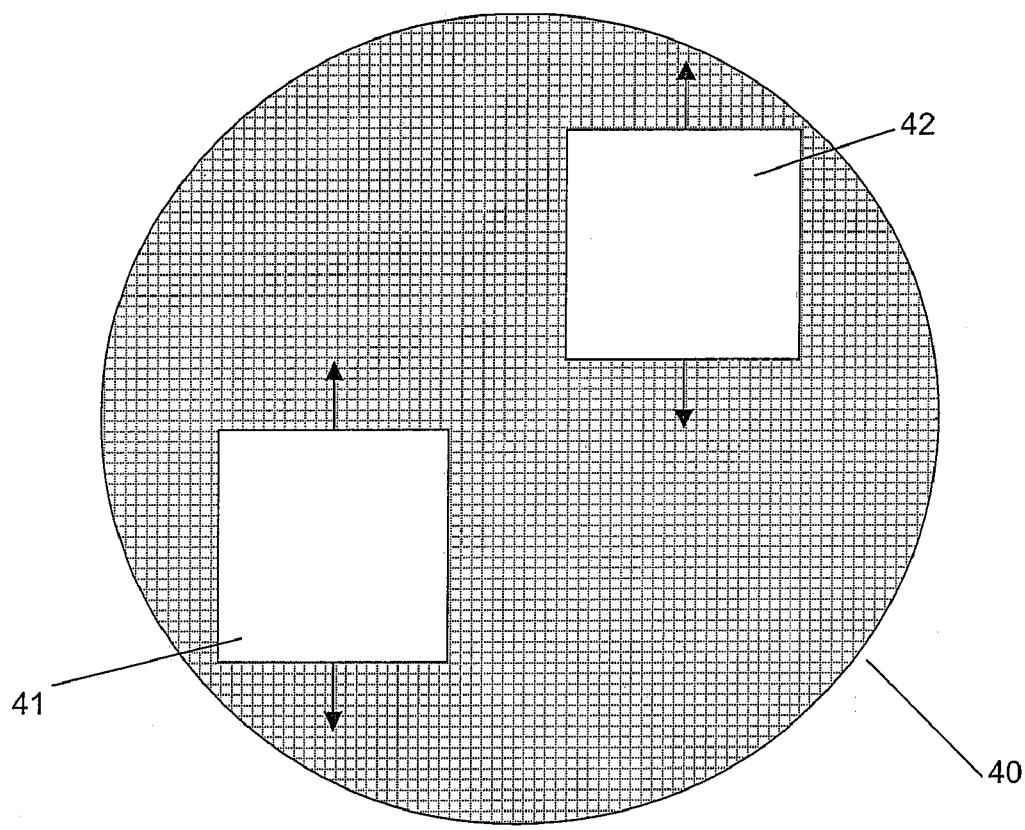
FIG. 4 illustrates a multi-stamp printing arrangement in accordance with an embodiment of the present invention.

FIG. 4 illustrates a substrate 40 substantially covered with an imprintable medium. First and second templates 41, 42 are moved parallel and adjacent one another to imprint a pattern defined by the templates 41, 42 respectively into the imprintable medium, which can then be replicated in the substrate by one or more rounds of etching to remove residual layers of imprintable medium remaining between pattern features after imprinting and then etch exposed areas of the substrate underlying the residual layers.

In an embodiment, the templates are fixed relative to one another such that they always print regions having a fixed spatial separation. According to an alternative embodiment, the templates are free to move relative to one another in order to better or optimally cover the area of the surface to be printed. A refinement of this embodiment involves at least one template having a smaller area than the other (or others). In such a system, the larger template(s) can imprint the main area of the substrate while the smaller template(s) can move around the edges of the printing area or between the gaps between the printed areas left by the larger template(s).

Figure 5:
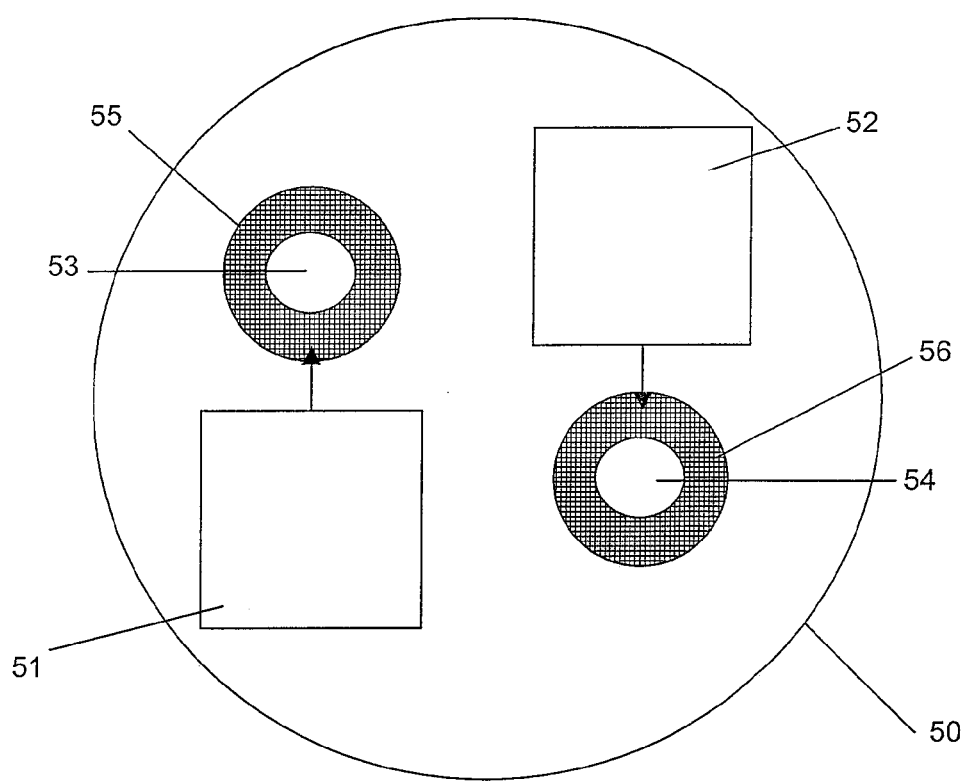
FIG. 5 illustrates a multi-stamp printing arrangement in accordance with an embodiment of the present invention in which the imprintable medium is provided by drop on demand.

The above embodiments may lend themselves for particular application to drop on demand processes (e.g., SFIL) in which the imprintable medium is applied to the substrate as required, rather than being dispensed across the entirety of the substrate prior to imprinting. Such an arrangement is illustrated in FIG. 5. A portion of a substrate 50 is being patterned using first and second templates 51, 52 which are moving anti-parallel and adjacent one another. Each template 51, 52 has an associated dispenser 53, 54 configured to dose a volume of imprintable medium 55, 56 immediately in front of the template 51, 52 (i.e., on a target portion of the substrate to be next imprinted) on a drop on demand basis. The drop on demand dispenser may, for instance, be mounted to move with the respective template.

Figure 6:
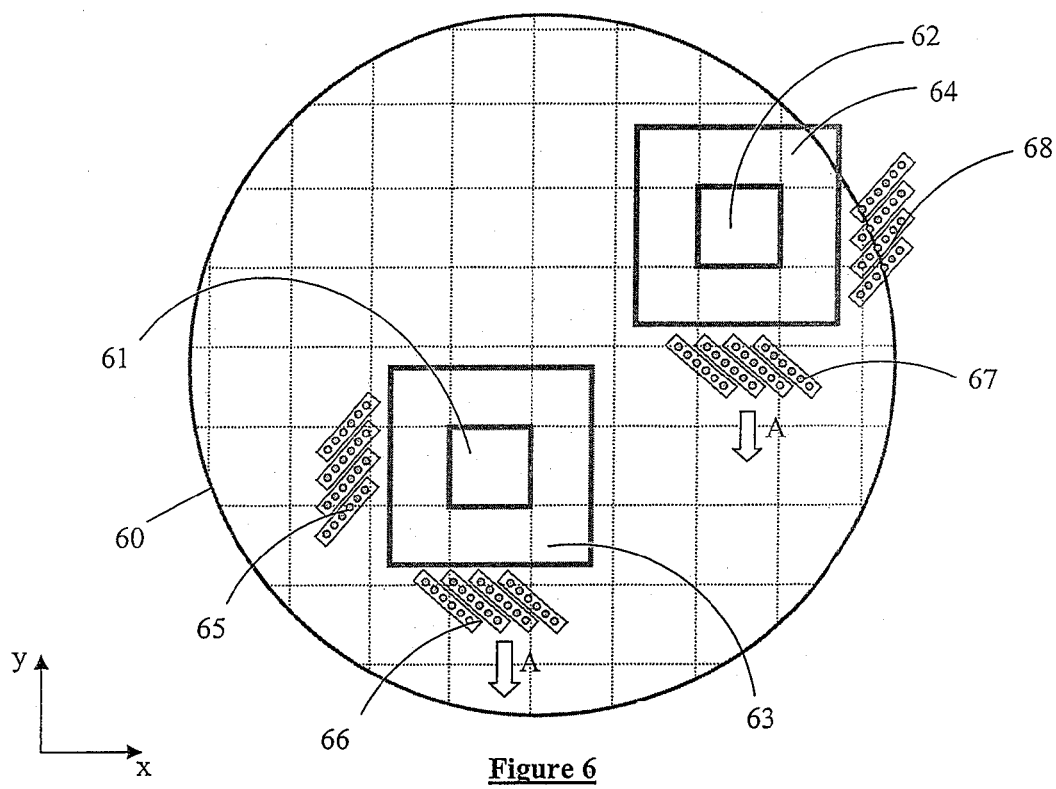
FIG. 6 illustrates a further multi-stamp printing arrangement in accordance with an embodiment of the present invention in which the imprintable medium is provided by drop on demand.

FIG. 6 schematically shows a further embodiment of the invention. Portions of a substrate 60 are patterned using first and second templates 61, 62 (the portions are delineated by dotted lines). Template holders 63, 64 hold the imprint template 61, 62. The imprint templates 61, 62 and template holders 63, 64 are moved parallel and adjacent to one another, as indicated by arrows A.

Each template 61, 62 has an associated plurality of dispensers 65-68. Those dispensers 66, 67, which are located in front of the imprint templates 61, 62 when they are moving in the direction indicated, are configured to dose volumes of imprintable medium (not illustrated) ahead of the imprint templates. This is done on a drop on demand basis. The dispensers 66, 67 are fixed to the template holders 63, 64, and are separated from the imprint templates 61, 62 by a certain distance. This allows a fixed timing to be set up between depositing the imprintable medium and applying the imprint template to the imprintable medium so that all the portions of the substrate have the same fixed timing. This may give very uniform processing conditions to all the portions on the substrate which may give better yield. By having the dispensers close to the template the fixed timing between depositing the imprintable medium and applying the imprint template to the imprintable medium may be very short which may be beneficial for throughput and may lower the amount of evaporation of the imprintable medium before applying of the imprint template to the imprintable medium.

In some instances in may be desired to move the imprint templates 61, 62 in the x-direction (this includes the negative x-direction) prior to imprint. Where this is done dispensers 65, 68 provided at appropriate sides of the template holders 63, 64 may be used. It will be appreciated that dispensers may be provided on other sides of the template holders 63, 64 if required or desired.

The dispensers 65-68 each comprise a plurality of apertures (these may, for example, be ink-jet nozzles) which are configured to dispense an array of droplets of imprintable medium onto the substrate 60. The plurality of apertures may, for example, be a two dimensional array, as shown in FIG. 6. The array of droplets of imprintable medium may, for example, be arranged to correspond with the dimensions of the imprint templates 61,62.

Figure 7:
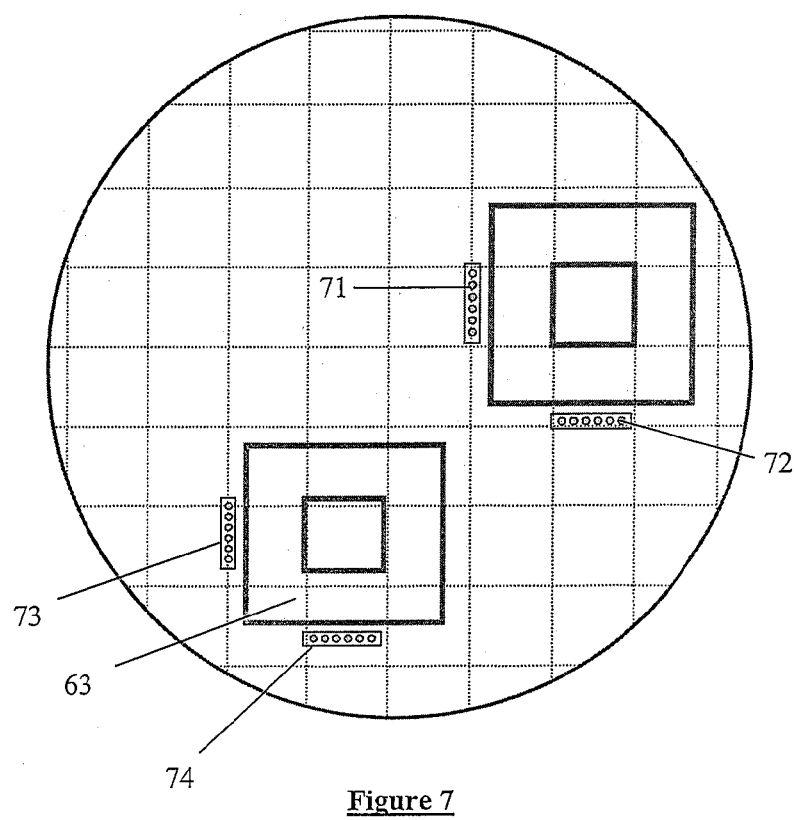
FIG. 7 illustrates a further multi-stamp printing arrangement in accordance with an embodiment of the present invention in which the imprintable medium is provided by drop on demand.

FIG. 7 schematically shows a further embodiment of the invention. The embodiment shown in FIG. 7 corresponds in large part with that shown in FIG. 6, except that instead of each dispenser comprising an array of apertures for dispensing imprintable medium, each dispenser 71-74 comprises a single row of apertures. The apertures may, for example, be inkjet nozzles. Where dispensers of this type are used, the imprintable medium may be dispensed when the template holders 63, 64 are moving between imprint positions. This allows the imprintable medium to be distributed across, for example, a portion of the substrate to be imprinted.

Although in some of the above described embodiments of the invention the dispensers have been referred to as being attached to template holders, it will be appreciated that the dispensers may in some instances be attached directly to imprint templates. In general, the dispensers are associated with imprint templates, and may be said to be fixed relative to imprint templates.

The throughput of the system may be improved or optimized by setting the timing between depositing imprintable medium and imprinting for each template, such that imprinting occurs either in or out of synchronisation. An improvement in throughput of approximately 30-70% may be achieved for a two template system by arranging the imprinting and curing times appropriately.

While specific embodiments of the invention have been described above, it will be appreciated that the invention may be practiced otherwise than as described. The description is not intended to limit the invention. For example, any number of templates having any appropriate size and/or shape may be employed to suit a particular application. Furthermore, the speed at which the templates are moved around the substrate may be monitored and controlled to provide a good or optimal imprinting rate for a specific substrate size and pattern density.

We claim:

1. An imprinting method, comprising:
   providing first and second spaced target regions of a substrate with imprintable medium;
   contacting the first and second spaced target regions with first and second templates respectively to form respective first and second imprints in the medium;
   separating the first and second templates from the imprinted medium;
   providing third and fourth spaced target regions of the substrate with imprintable medium;
   displacing the first template in a first direction from the first region to a third region of the medium and displacing the second template in a second direction from the second region to a fourth region of the medium; and
   contacting the third and fourth target regions with the first and second templates respectively to form respective third and fourth imprints in the medium.

2. The method according to claim 1, comprising providing separate first, second, third and fourth volumes of the imprintable medium on the substrate to provide the spaced target regions of the medium.

3. The method according to claim 1, wherein the first direction is substantially parallel to the second direction.

4. The method according to claim 1, wherein the first and second templates contact the medium simultaneously.

5. The method according to claim 1, wherein the first and second templates contact the medium sequentially.

6. An imprinting apparatus, comprising:
   a substrate table configured to hold a substrate;
   a template support configured to support first and second templates, the template support configured to cause the first and second templates to contact first and second spaced target regions respectively of an imprintable medium on the substrate to form respective first and second imprints in the medium and to cause the first and second templates to separate from the imprinted medium; and
   a first dispenser configured to provide a first volume of the imprintable medium and a second dispenser configured to provide a second volume of the imprintable medium, to provide the first and second spaced target regions.

7. The apparatus according to claim 6, wherein the first and second dispensers are associated with the first and second templates respectively.

8. The apparatus according to claim 7, wherein the first and second dispensers are fixed relative to the first and second templates respectively.

9. The apparatus according to claim 7, wherein the first and second dispensers are provided with a plurality of apertures.

10. The apparatus according to claim 9, wherein the plurality of apertures comprises a two-dimensional array of apertures.

11. The apparatus according to claim 9, wherein the plurality of apertures comprises a single row of apertures.

12. The apparatus according to claim 6, wherein the dispensers are configured to provide separate third and fourth volumes of the imprintable medium on the substrate to provide third and fourth spaced target regions.

13. The apparatus according to claim 12, wherein the template support is operable such that, after separating the first and second templates from the first and second regions of the imprinted medium, the first template is displaced in a first direction from the first region to the third region of the medium and the second template is displaced in a second direction from the second region to the fourth region of the medium, and the template support is operable to cause the third and fourth target regions to be contacted with the first and second templates respectively to form respective third and fourth imprints in the medium.

14. The apparatus according to claim 13, wherein the first direction is substantially parallel to the second direction.

15. The apparatus according to claim 6, wherein the template support is operable so that the first and second templates contact the first and second regions of the medium simultaneously.

16. The apparatus according to claim 6, wherein the template support is operable so that the first and second templates contact the first and second regions of the medium sequentially.

17. The apparatus according to claim 6, wherein the template support is configured so that the first template is fixed relative to the second template.

18. The apparatus according to claim 6, wherein the template support is configured so that the first template is moveable relative to the second template.

19. An imprinting apparatus, comprising:
a substrate table configured to hold a substrate;
a template support configured to support a plurality of templates, the template support configured to cause the plurality of templates to contact a first set of respective spaced apart target regions of imprintable medium on the substrate to form imprints in the medium,
wherein the apparatus is configured to cause the plurality of templates to contact a second set of respective spaced apart target regions of imprintable medium on the substrate to form imprints in the medium, the second set of target regions displaced from the first set of target regions on the substrate, and
a dispenser configured to provide separate volumes of imprintable medium on the substrate to provide the respective target regions, the dispenser comprising a first dispenser and a second different dispenser, the first dispenser configured to provide the imprintable medium on the substrate from a first side of the plurality of templates and the second dispenser configured to provide imprintable medium on the substrate from a second different side of the plurality of templates.

20. The apparatus according to claim 19, comprising a dispenser configured to provide a volume of imprintable medium on the substrate while supported on the substrate table.

21. The apparatus according to claim 20, wherein the dispenser is configured to provide the volume of imprintable medium during or after the template support causes the templates to contact the respective target regions.

22. The apparatus according to claim 19, wherein the first side is opposite the second side.

23. The apparatus according to claim 19, comprising a dispenser configured to provide the imprintable medium on the substrate from at least two different sides of the plurality of templates.

24. An imprinting apparatus, comprising:
a substrate table configured to hold a substrate;
a template support configured to support a plurality of templates, the template support configured to cause the plurality of templates to contact respective spaced target regions of an imprintable medium on the substrate to form imprints in the medium; and
a dispenser configured to provide the imprintable medium on the substrate from at least two different sides of the plurality of templates, wherein the dispenser comprises a first dispenser and a second different dispenser, the first dispenser configured to provide the imprintable medium on the substrate from a first side of the plurality of templates and the second dispenser configured to provide imprintable medium on the substrate from a second different side of the plurality of templates.

25. The apparatus according to claim 24, wherein the dispenser is configured to provide the imprintable medium on the substrate from at least two different sides of each of the plurality of templates.

26. The apparatus according to claim 24, wherein the at least two different sides are substantially perpendicular to each other.

27. The apparatus according to claim 24, wherein the first side is opposite the second side.

28. The apparatus according to claim 24, wherein the dispenser comprises a plurality of apertures to provide the imprintable medium to the substrate.

29. The apparatus according to claim 28, wherein the plurality of apertures comprises a two-dimensional array of apertures.

30. The apparatus according to claim 24, wherein the dispenser is fixed relative to the templates.

31. The apparatus according to claim 24, wherein the dispenser comprises a first dispenser and a second different dispenser, wherein the first and second dispensers are associated with a separate respective template.

32. An imprinting apparatus, comprising:
a substrate table configured to hold a substrate;
a template support configured to support a plurality of templates, the template support configured to cause the plurality of templates to contact respective spaced target regions of an imprintable medium on the substrate to form imprints in the medium; and
a dispenser configured to provide the imprintable medium on the substrate for each template, each dispenser configured to provide the imprintable medium for the respective target region of that template just prior to contact with that template,
wherein at least one dispenser is configured to provide the imprintable medium on the substrate from a first side of the plurality of templates, and at least one other dispenser is configured to provide the imprintable medium on the substrate from a second different side of the plurality of templates.

33. The apparatus according to claim 32, wherein each dispenser is in a substantially same spatial relationship to each respective template to allow a fixed timing between supply of imprintable medium and contact of the imprintable medium with the respective template.

34. The apparatus according to claim 32, wherein each of dispensers are fixed relative to its respective template.

35. The apparatus according to claim 32, wherein each of the dispensers comprises a plurality of apertures to provide the imprintable medium to the substrate.

36. An imprinting method, comprising:
 providing a plurality of spaced apart target regions of a substrate with imprintable medium from at least two different sides of a plurality of templates using a dispenser; and
 contacting each of the target regions with a respective template to form a respective imprint in the medium,
 wherein providing the plurality of spaced apart target regions with imprintable medium and the contacting each of the target regions with the respective template comprises:
 providing imprintable medium from one side of the plurality of templates using the dispenser;
 contacting the target regions having the imprintable medium from the one side with the templates;
 providing imprintable medium from a different side of the plurality of templates using the dispenser; and
 contacting the target regions having the imprintable medium from the different side with the templates.

37. The method according to claim 36, comprising providing the plurality of spaced apart target regions of the substrate with imprintable medium from at least two different sides of each of the plurality of templates using the dispenser.

38. The method according to claim 36, wherein the at least two different sides comprises a first side and a second side, the second side opposite the first side.

39. An imprinting method, comprising:
 contacting each of a plurality of spaced apart target regions of imprintabie medium of a substrate with a respective template of a plurality of templates to form a respective imprint in the medium; and
 just prior to contact with the respective template, providing imprintable medium on each of the respective target regions of the respective templates using a respective dispenser of a plurality of dispensers,
 wherein providing imprintable medium on each of the respective target regions of the respective templates comprises providing the imprintable medium on the substrate from a first side of the plurality of templates using at least one dispenser, and providing the imprintable medium on the substrate from a second different side of the plurality of templates using at least one other dispenser.

40. The method according to claim 39, wherein the first side is opposite the second side.

\* \* \* \* \*